United States Patent [19]

Juskey et al.

[11] Patent Number: 5,542,171
[45] Date of Patent: Aug. 6, 1996

[54] METHOD OF SELECTIVELY RELEASING PLASTIC MOLDING MATERIAL FROM A SURFACE

[75] Inventors: Frank J. Juskey; Anthony B. Suppelsa, both of Coral Springs; Fadia Nounou, Plantation, all of Fla.

[73] Assignee: Motorola, Inc., Schaumburg, Ill.

[21] Appl. No.: 771,663

[22] Filed: Oct. 4, 1991

[51] Int. Cl.⁶ .............................. H01K 3/10; B29C 45/14
[52] U.S. Cl. .................. 29/840; 264/130; 264/161; 264/272.17; 264/276; 29/841; 29/850
[58] Field of Search ...................... 264/130, 161, 264/272.17, 276; 204/192.32; 29/850, 840, 841

[56] References Cited

U.S. PATENT DOCUMENTS 4,460,537  7/1984  Heinle ........................... 264/272.17
4,795,600  1/1989  Kromrey ............................ 264/130
4,906,311  3/1990  Gurol ............................ 264/272.11

*Primary Examiner*—Jan H. Silbaugh
*Assistant Examiner*—Angela Ortiz
*Attorney, Agent, or Firm*—Dale W. Dorinski

[57] ABSTRACT

A method of making a transfer molded chip carrier. A semiconductor device (10) is first electrically and mechanically attached to a substrate (12). The substrate (12) is then treated by sputter etching so that it will provide good adhesion between the substrate and a molding compound (18) that is subsequently molded to the substrate (25). Portions of the treated substrate are then selectively contaminated in order to reduce the adhesion between these selected portions of the substrate and the molding compound. The molding compound is then formed around the semiconductor device so as to encapsulate it and also part of the surface of the substrate. Portions (20) of the transfer molded material that were molded over the selectively contaminated portions of the substrate (12) are then removed by breaking away.

7 Claims, 2 Drawing Sheets

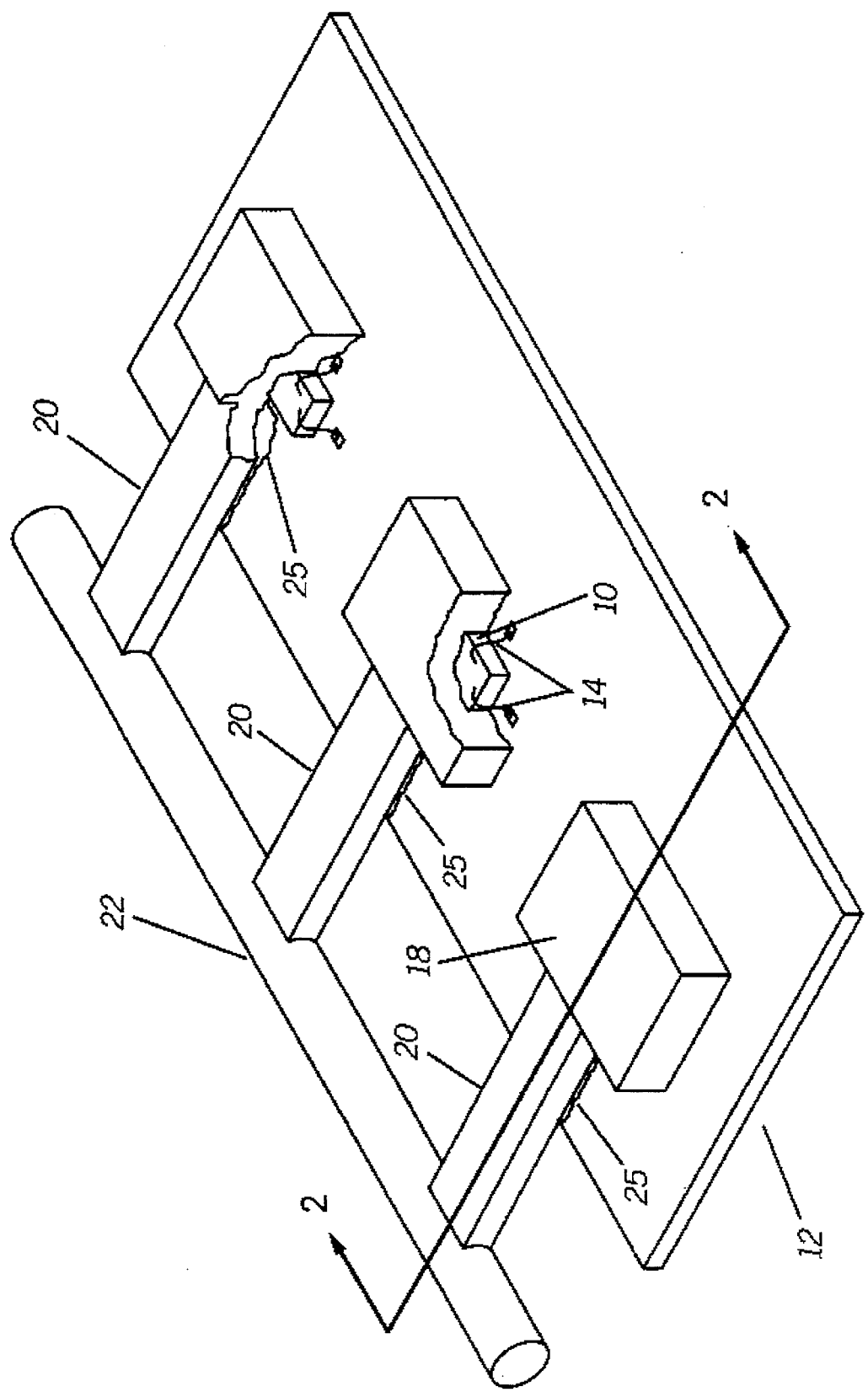

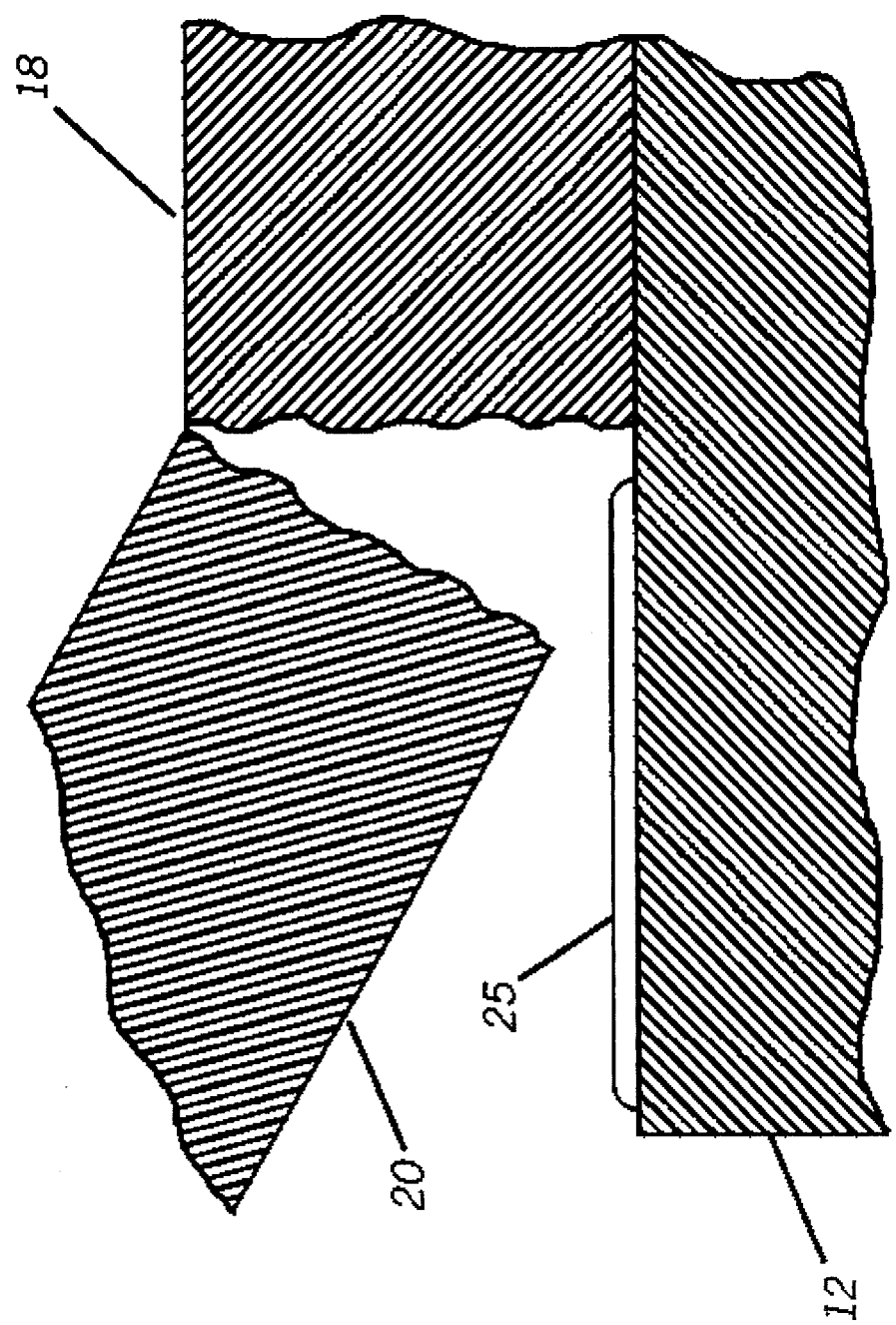

5,542,171

METHOD OF SELECTIVELY RELEASING PLASTIC MOLDING MATERIAL FROM A SURFACE

TECHNICAL FIELD

This invention relates generally to a method of molding plastic material and more particularly to a method of selectively releasing a molded plastic material from a surface.

BACKGROUND

Plastic encapsulation of semiconductor devices by transfer molding is a well known and much used technique. In a typical application, a large number of components or devices are placed in an open multicavity mold with one or more devices in each cavity. For manufacturing convenience, the devices are often coupled, that is, connected together on ladder-like lead frames or substrates. When the mold is closed, the two mold portions, usually called platens or halves, seal against the lead frame or substrate to prevent the border of the frame or substrate from being covered by the injected plastic. The cavities in the mold are connected by a tree-like array of channels or runners connected to a central reservoir from which the molten plastic is fed. Usually, gates, that is, constricted channel regions, are placed at the entrance to each semiconductor device to channel and control the flow and injection velocity of the plastic into the cavity and to permit removal of the finished part which has solidified in the runners.

Typically, powdered or pelletized plastic is placed in a central reservoir and compressed by a ram. The mold and the reservoir are hot. The combination of heat and pressure causes the plastic to liquify and flow through the runners and gates into the individual molding cavities, subsequently encapsulating the semiconductor device and hardening. The mold halves are then separated and the encapsulated parts are removed and trimmed of excess plastic, such as the runners and gates. This removal of the runners and gates can pose a significant problem when molding to lead frames or substrates.

In order to manufacture a quality device, the adhesion of the molding compound to the lead frame or substrate must be maximized. However, this adhesion poses problems when attempting to remove the gate or runner from the substrate. The excellent adhesion of the gate to the substrate causes the substrate to delaminate when the adhesive force between the plastic and the substrate exceeds the cohesive strength of the substrate itself. This creates a defective part which is undesirable. An alternative arrangement of gates or runners that injects the plastic from the top has been used, but this requires a more complex and expensive molding setup.

Thus, a need continues to exist for an improved molding method whereby a simple, two-part mold may be used with conventional gating systems. A gating system employing such a mold that also permits easy release and removal of the molding gate from the substrate, without damaging the substrate, would be highly desired by those in the art.

SUMMARY OF THE INVENTION

Briefly, according to the invention, there is provided a method of making a transfer molded chip carrier. A semiconductor device is first electrically and mechanically attached to a substrate. Portions of the substrate are then selectively contaminated in order to reduce the adhesion between these selected portions of the substrate and a molding compound subsequently molded to the substrate. The molding compound is then formed around the semiconductor device so as to encapsulate it and also part of the surface of the substrate. Portions of the transfer molded material that were molded over the selectively contaminated portions of the substrate are then removed by breaking away.

In an alternate embodiment of the invention, the substrate surface is first treated by sputter etching in order to clean and microscopically roughen the surface. A further embodiment employs a permanent ink-type pen or marker to selectively contaminate portions of the surface of the treated substrate.

BRIEF DESCRIPTION OF THE DRAWINGS

FIG. 1 is a portable cut-away isometric view of a transfer molded chip carrier in accordance with the invention.

FIG. 2 is a fragmentary cross-sectional view of FIG. 1 through section 2—2 showing the molding gate after peeling away from the substrate.

DETAILED DESCRIPTION OF THE PREFERRED EMBODIMENT

Referring now to FIG. 1, a semiconductor device 10 is encapsulated by mechanically attaching it to a substrate 12. The semiconductor device 10 is mounted onto the substrate 12, typically by use of a die attach adhesive such as a silver-filled epoxy adhesive. The semiconductor 10 is also electrically connected to a series of runners or circuit traces on substrate 12 by means of wire bonds 14. The device may also be TAB or flip-chip mounted to the substrate. The illustration in FIG. 1 depicts three semiconductor devices mounted to a substrate strip. However, the chip carriers may be manufactured by molding individual semiconductor devices or by placing greater numbers of semiconductor devices per substrate. Those skilled in the art will recognize that the chip carrier may be molded in single or in an array format and the number of devices per array is limited by mold size and other economic considerations.

After the semiconductor devices 10 are mounted on the substrate 12, an optional step of treating the substrate in order to increase the adhesion of a material 18 that is subsequently transfer molded is performed. The material is preferably a transfer molding compound, but may also be any other type of plastic molding compound, such as epoxies, urethanes, silicones, polyamides, polyimides, etc. This treatment serves to alter the surface of the substrate in order that the molding material will have greater adhesion to the substrate. It is extremely important that the molding material adhere and bond tightly to the substrate in order to prevent intrusion of moisture and other environmental contaminants into the semiconductor device package. The surface treatment alters the surface by roughening it in a macroscopic or microscopic manner in order to provide better mechanical and chemical adhesion to the molding compound. Numerous surface treatments may be utilized such as mechanically etching, chemically etching, etching by plasma gas discharge, cleaning, polishing, roughening, sputter etching in a vacuum system, or other equivalent means of altering the surface.

In the preferred embodiment, the surface of the substrate or printed circuit board is altered by microscopically roughening the surface by etching in a plasma gas discharge and/or by sputter etching in a sputtering chamber. Techniques for plasma etching or sputter etching are well known to those skilled in the art, and the etching step is performed under vacuum in a plasma chamber or sputtering chamber.

After the surface has been treated to increase adhesion, selected portions of the surface must, subsequently, be further treated to reduce the adhesion. These portions are those areas wherein the gates 20 from the central runner 22 are led into the molding cavities to form the body 18 of the molded device. Each of the gates 20 must be removed from the substrate and the molded body 18 of the chip carrier prior to completion of the chip carrier. The gates 20 are typically removed by snapping or peeling away from the substrate 12. Because the surface of the substrate has been altered to increase the adhesion, the adhesive strength between the gate 20 and the substrate 12 exceeds the cohesive strength of the substrate 12 itself, resulting in delamination or rupturing of the substrate 12.

In the preferred embodiment, portions of the surface of the substrate 12 are altered to reduce the adhesion at the locations of each of the gates 20. The adhesion is reduced by selectively contaminating those portions of the surface under the gates. This selective contamination is accomplished by applying a coating 25 of a permanent type ink to the surface in the localized area. Permanent marking inks are comprised of solvent miscible aniline, phenolic, or epoxy dyes, metal salts such as ferrous sulfate or silver nitrate, glues or adhesives such as epoxies or acrylates, wetting agents, dryers, and a diluent or vehicle of the aldehyde or ketone family of solvents. The selective contamination can most effectively be accomplished by the use of a pen or marker. Certain types of pens have been found to be more effective than others, namely: those pens that are classified as permanent type markers. Examples of the types of materials that have been found to be very effective are the BEROL®8800 indelible ink pen, the Fisher Scientific MANOMARKER® pen, (Catalog Number 13–385), black PILOT® pens and yellow China markers. Each of these pens may be classified as a permanent type pen, that is, the ink does not wash off with water. Non-permanent or temporary writing inks are formulated from glycol-soluble or water-soluble dyes, natural or synthetic gums or adhesives, dryers, wetting agents and a diluent or vehicle of the alcohol or glycol family of solvents. Conventional temporary or water-soluble type inks that are based on ethylene glycol do not function effectively as releasing agents for the molding process.

The use of permanent type inks and markers also confines the contamination within a localized area as opposed to it being released and swept into the molded cavity. Permanent inks are preferred over other types of markers because they seem to provide a thicker coating. Permanent inks create a resilient coating that cannot be easily removed by the solvating action of the molten molding compound or abraded by the filler in the molding compound. Therefore, this selective contamination is a reliable means that will not contaminate other parts of the molding process.

After the substrate 12 has been selectively contaminated at with the marking ink 25, the substrate and semiconductor devices are placed into a transfer molding system consisting of a plurality of independent mold cavities arranged in rows, each mold cavity is connected to an adjacent slot by a short channel or gate 20 that connects to the main sprue 22. The parts are encapsulated by transfer molding a plastic materials, such as an epoxy resin or modified epoxy resin, into the cavity. The art of transfer molding semiconductor devices is well known to those skilled in the art and may be found, for example, in U.S. Pat. No. 4,460,537, issued to Preston Heinle.

After the molding is complete, the runners 20 are broken or peeled away from the substrate 12 as shown in FIG. 2. Because the surface of the substrate has been selectively contaminated at the with the marks 25, the adhesion of the molding compound to the substrate at these locations is significantly less than the adhesion of the molding compound 18 at the main body encapsulated device. Therefore, the runners 20 cleanly break away from the substrate 12 without affecting the adhesion of the main body 18 to the substrate 12. The substrate 12 may then be excised into individual portions to form the completed chip carriers.

In summary, it may be seen that by selectively treating portions of the surface of a substrate, a semiconductor device or other comparable device may be manufactured wherein gates may be utilized and cleanly released from the substrate after molding. The use of such a selective contamination system provides extreme flexibility in the location and size of the areas that are to be selectively treated and also reduces or eliminates entirely the damage to the substrate that is seen in the prior art. For purposes of illustration, the authors have shown a transfer molded chip carrier. However, other applications of this technology may be used, for example, potting or encapsulating devices or artifacts with liquid resin, transfer molding or insert molding other types of artifacts by conventional insert-molding techniques, and this technique may also be used as a means for identifying those parts that have been properly treated prior to the molding step. The marking operation produces a readily identifiable feature on the substrate 12 that may be used to identify those parts that have been treated.

Many other variations are possible. Accordingly, it is intended to encompass all such variations as fall within the spirit and scope of the present invention.

What is claimed is:

1. A method of forming a transfer molded chip carrier, comprising:

electrically and mechanically attaching a semiconductor device to a substrate;

selectively contaminating at least a portion of the substrate in order to reduce adhesion between said portion of the substrate and a molding compound subsequently attached to the substrate;

encapsulating the semiconductor device by molding a plastic molding compound onto the device and the substrate; and breaking away the plastic molding compound that is molded over said selectively contaminated portion of the substrate.

2. The method of forming a transfer molded chip carrier as described in claim 1, wherein the step of selectively contaminating comprises applying a coating of a polymer.

3. The method of forming a transfer molded chip carrier as described in claim 1, wherein the step of selectively contaminating comprises marking with a permanent ink pen, or a china marker.

4. A method of forming a transfer molded chip carrier, comprising:

electrically and mechanically attaching a semiconductor device to a substrate comprising a printed circuit material;

sputter etching at least one surface of the substrate in order to increase adhesion between the substrate and a transfer molding compound subsequently attached to the substrate;

selectively depositing a coating of a permanent ink on at least a portion of the sputter etched surface in order to reduce adhesion between the substrate surface and a transfer molding compound subsequently attached to the substrate;

encapsulating the semiconductor device by transfer molding a plastic molding compound onto the sputter etched substrate surface and the semiconductor device, said plastic molding compound completely encapsulating the semiconductor device; and breaking away the plastic molding compound that is over the selectively coated portion of the sputter etched surface.

5. The method of forming a transfer molded chip carrier as described in claim 4, wherein the step of selectively depositing a coating comprises marking with a permanent ink pen, or a china marker.

6. A method of releasing a molding cavity entrance gate from a substrate surface being overmolded without damaging the substrate surface, comprising selectively contaminating the substrate surface with a carbon containing material, molding a plastic molding compound onto the substrate surface, and removing the molding cavity entrance gate by peeling it from the substrate surface.

7. A method of selectively releasing molding materials from a surface being potted without damaging the surface, comprising selectively contaminating at least a portion of the surface with a carbon containing material, potting the molding material onto the surface, and removing the potted material from the contaminated portion of the surface by peeling the potted molding material from the surface.

* * * * *